(12) United States Patent
Anderson et al.

(10) Patent No.: US 8,946,814 B2
(45) Date of Patent: Feb. 3, 2015

(54) SUPERJUNCTION DEVICES HAVING NARROW SURFACE LAYOUT OF TERMINAL STRUCTURES, BURIED CONTACT REGIONS AND TRENCH GATES

(71) Applicant: Icemos Technology Ltd., Belfast (GB)

(72) Inventors: Samuel Anderson, Tempe, AZ (US); Takeshi Ishiguro, Aizuwakamatsu (JP)

(73) Assignee: Icemos Technology Ltd., Belfast (GB)

( * ) Notice: Subject to any disclaimer, the term of this patent is extended or adjusted under 35 U.S.C. 154(b) by 0 days.

(21) Appl. No.: 13/857,715

(22) Filed: Apr. 5, 2013

(65) Prior Publication Data

US 2013/0299900 A1 Nov. 14, 2013

Related U.S. Application Data

(60) Provisional application No. 61/620,635, filed on Apr. 5, 2012.

(51) Int. Cl.
*H01L 31/062* (2012.01)
*H01L 31/113* (2006.01)
*H01L 31/119* (2006.01)
(Continued)

(52) U.S. Cl.
CPC ...... *H01L 29/7813* (2013.01); *H01L 29/66734* (2013.01); *H01L 29/41766* (2013.01); *H01L 29/42364* (2013.01); *H01L 29/42372* (2013.01); *H01L 29/66727* (2013.01); *H01L 29/0634* (2013.01); *H01L 29/1095* (2013.01); *H01L 29/7308* (2013.01); *H01L 29/7371* (2013.01); *H01L 29/7393* (2013.01); *H01L 29/74* (2013.01); *H01L 29/861* (2013.01); *H01L 21/26586* (2013.01); *H01L 29/4236* (2013.01);
(Continued)

(58) Field of Classification Search
USPC .................. 257/288, 330, 491, 496, E29.257; 438/197, 270, 271, 272
See application file for complete search history.

(56) References Cited

U.S. PATENT DOCUMENTS 3,404,295 A 10/1968 Warner, Jr.
3,497,777 A 2/1970 Teszner
(Continued)

FOREIGN PATENT DOCUMENTS

| JP | 52038889 A | 3/1977 |
| WO | 2005001941 A2 | 1/2005 |
| WO | 2005031880 A1 | 4/2005 |

OTHER PUBLICATIONS

Chenming Hu; Optimum Doping Profile for Minimum Ohmic Resistance and High-Breakdown Voltage; IEEE Transaction on Electron Devices, vol. ED-26, No. 3, pp. 243-244; Mar. 1979.
(Continued)

*Primary Examiner* — Phuc Dang
(74) *Attorney, Agent, or Firm* — Panitch Schwarze Belisario & Nadel LLP (57) ABSTRACT

Superjunction semiconductor devices having narrow surface layout of terminal structures and methods of manufacturing the devices are provided. The narrow surface layout of terminal structures is achieved, in part, by connecting a source electrode to a body contact region within a semiconductor substrate at a body contact interface comprising at least a first side of the body contact region other than a portion of a first main surface of the semiconductor substrate.

10 Claims, 5 Drawing Sheets

(51) Int. Cl.
*H01L 29/78* (2006.01)
*H01L 29/66* (2006.01)
*H01L 29/417* (2006.01)
*H01L 29/423* (2006.01)
*H01L 29/06* (2006.01)
*H01L 29/10* (2006.01)
*H01L 29/73* (2006.01)
*H01L 29/737* (2006.01)
*H01L 29/739* (2006.01)
*H01L 29/74* (2006.01)
*H01L 29/861* (2006.01)
*H01L 21/265* (2006.01)
*H01L 29/49* (2006.01)

(52) U.S. Cl.
CPC ........... *H01L29/495* (2013.01); *H01L 29/4975* (2013.01); *H01L 29/0653* (2013.01)
USPC ........... 257/330; 257/288; 257/491; 438/197; 438/270

(56) References Cited

U.S. PATENT DOCUMENTS

| | | | |
|---|---|---|---|
| 3,564,356 A | 2/1971 | Wilson | |
| 4,158,206 A | 6/1979 | Neilson | |
| 4,211,582 A | 7/1980 | Horng et al. | |
| 4,238,278 A | 12/1980 | Antipov | |
| 4,491,486 A | 1/1985 | Iwai | |
| 4,754,310 A | 6/1988 | Coe | |
| 4,775,881 A | 10/1988 | Ploog et al. | |
| 4,821,095 A | 4/1989 | Temple | |
| 4,866,004 A | 9/1989 | Fukushima | |
| 4,868,624 A | 9/1989 | Grung et al. | |
| 4,895,810 A | 1/1990 | Meyer et al. | |
| 4,994,406 A | 2/1991 | Vasquez et al. | |
| 5,019,522 A | 5/1991 | Meyer et al. | |
| 5,027,180 A | 6/1991 | Nishizawa et al. | |
| 5,045,903 A | 9/1991 | Meyer et al. | |
| 5,105,243 A | 4/1992 | Nakagawa et al. | |
| 5,216,275 A | 6/1993 | Chen | |
| 5,218,226 A | 6/1993 | Slatter et al. | |
| 5,219,777 A | 6/1993 | Kang | |
| 5,366,914 A | 11/1994 | Takahashi et al. | |
| 5,389,815 A | 2/1995 | Takahashi | |
| 5,395,790 A | 3/1995 | Lur | |
| 5,418,376 A | 5/1995 | Muraoka et al. | |
| 5,430,311 A | 7/1995 | Murakami et al. | |
| 5,432,113 A | 7/1995 | Tani | |
| 5,435,888 A | 7/1995 | Kalnitsky et al. | |
| 5,438,215 A | 8/1995 | Tihanyi | |
| 5,472,888 A | 12/1995 | Kinzer | |
| 5,506,421 A | 4/1996 | Palmour | |
| 5,510,287 A | 4/1996 | Chen et al. | |
| 5,519,245 A | 5/1996 | Tokura et al. | |
| 5,572,048 A | 11/1996 | Sugawara | |
| 5,598,018 A | 1/1997 | Lidow et al. | |
| 5,726,469 A | 3/1998 | Chen | |
| 5,742,087 A | 4/1998 | Lidow et al. | |
| 5,744,994 A | 4/1998 | Williams | |
| 5,786,619 A | 7/1998 | Kinzer | |
| 5,902,127 A | 5/1999 | Park | |
| 5,926,713 A | 7/1999 | Hause et al. | |
| 5,929,690 A | 7/1999 | Williams | |
| 5,939,754 A | 8/1999 | Hoshi | |
| 5,998,292 A | 12/1999 | Black et al. | |
| 6,008,106 A | 12/1999 | Tu et al. | |
| 6,011,298 A | 1/2000 | Blanchard | |
| 6,066,878 A | 5/2000 | Neilson | |
| 6,081,009 A | 6/2000 | Neilson | |
| 6,165,870 A | 12/2000 | Shim et al. | |
| 6,174,773 B1 | 1/2001 | Fujishima | |
| 6,184,555 B1 | 2/2001 | Tihanyi et al. | |
| 6,190,970 B1 | 2/2001 | Liao et al. | |
| 6,198,127 B1 | 3/2001 | Kocon | |
| 6,214,698 B1 | 4/2001 | Liaw et al. | |
| 6,222,229 B1 | 4/2001 | Hebert et al. | |
| 6,239,463 B1 | 5/2001 | Williams et al. | |
| 6,265,281 B1 | 7/2001 | Reinberg | |
| 6,291,856 B1 | 9/2001 | Miyasaka et al. | |
| 6,300,171 B1 | 10/2001 | Frisina | |
| 6,307,246 B1 | 10/2001 | Nitta et al. | |
| 6,309,929 B1 | 10/2001 | Hsu et al. | |
| 6,310,365 B1 | 10/2001 | Chen | |
| 6,359,309 B1 | 3/2002 | Liao et al. | |
| 6,362,505 B1 | 3/2002 | Tihanyi | |
| 6,365,958 B1 | 4/2002 | Ibnabdeljalil et al. | |
| 6,391,723 B1 | 5/2002 | Frisina | |
| 6,406,975 B1 | 6/2002 | Lim et al. | |
| 6,410,958 B1 | 6/2002 | Usui et al. | |
| 6,426,991 B1 | 7/2002 | Mattson et al. | |
| 6,452,230 B1 | 9/2002 | Boden, Jr. | |
| 6,459,124 B1 | 10/2002 | Zhang et al. | |
| 6,465,325 B2 | 10/2002 | Ridley et al. | |
| 6,495,421 B2 | 12/2002 | Luo | |
| 6,501,130 B2 | 12/2002 | Disney | |
| 6,501,146 B1 | 12/2002 | Harada | |
| 6,504,230 B2 | 1/2003 | Deboy et al. | |
| 6,509,220 B2 | 1/2003 | Disney | |
| 6,512,267 B2 | 1/2003 | Kinzer et al. | |
| 6,534,367 B2 | 3/2003 | Peake et al. | |
| 6,534,379 B1 | 3/2003 | Fisher et al. | |
| 6,566,201 B1 | 5/2003 | Blanchard | |
| 6,613,644 B2 | 9/2003 | Lachner | |
| 6,624,494 B2 | 9/2003 | Blanchard et al. | |
| 6,635,906 B1 | 10/2003 | Chen | |
| 6,686,244 B2 | 2/2004 | Blanchard | |
| 6,710,400 B2 | 3/2004 | Blanchard | |
| 6,710,403 B2 | 3/2004 | Sapp | |
| 6,710,418 B1 | 3/2004 | Sapp | |
| 6,713,813 B2 | 3/2004 | Marchant | |
| 6,762,473 B1 | 7/2004 | Goushcha et al. | |
| 6,787,872 B2 | 9/2004 | Kinzer et al. | |
| 6,797,589 B2 | 9/2004 | Adams et al. | |
| 6,812,525 B2 | 11/2004 | Bul et al. | |
| 6,936,867 B2 | 8/2005 | Chen | |
| 6,936,907 B2 | 8/2005 | Chen | |
| 6,979,862 B2 | 12/2005 | Henson | |
| 7,015,104 B1 | 3/2006 | Blanchard | |
| 7,023,069 B2 | 4/2006 | Blanchard | |
| 7,041,560 B2 | 5/2006 | Hshieh | |
| 7,052,982 B2 | 5/2006 | Hshieh et al. | |
| 7,109,110 B2 | 9/2006 | Hshieh | |
| 8,247,296 B2* | 8/2012 | Grivna | 438/270 |
| 8,519,473 B2* | 8/2013 | Meiser et al. | 257/329 |
| 2002/0070418 A1 | 6/2002 | Kinzer et al. | |
| 2005/0116313 A1 | 6/2005 | Lee et al. | |
| 2005/0176192 A1 | 8/2005 | Hshieh | |
| 2005/0215027 A1 | 9/2005 | Williams et al. | |
| 2005/0242411 A1 | 11/2005 | Tso | |
| 2006/0205174 A1 | 9/2006 | Hshieh et al. | |
| 2010/0013552 A1* | 1/2010 | Darwish et al. | 327/581 |
| 2010/0109077 A1* | 5/2010 | Banerjee et al. | 257/328 |

OTHER PUBLICATIONS

Victor A.K. Temple et al.; A 600-Volt MOSFET Designed for Low On-Resistance; IEEE Transactions on Electron Devices, vol. ED-27, No. 2, pp. 343-349; Feb. 1980.

Xing-Bi Chen et al.; Optimum Doping Profile of Power MOSFET; IEEE Transactions on Electron Devices, vol. ED-29, No. 6; pp. 985-987; Jun. 1982.

P. Rossel; Power M.O.S. Devices; Microelectron, reliab., vol. 24, No. 2, pp. 339-366; 1984.

Fujihira, Tatsuhiko; "Theory of Semiconductor Superjunction Devices;" Jpn. J. Appl. Phys., vol. 36, pp. 6254-6262; 1997.

Yamauchi et al.; "Electrical Properties of Super Junction p-n- Diodes Fabricated by Trench Filling;" 15th International Symposium on Power Semiconductor Devices and ICs, pp. 207-210; 2003.

(56) References Cited

OTHER PUBLICATIONS

Saito et al.; "600V Semi-superjunction MOSFET;" Papers of Technical Meeting on Electron Devices; IEE Japan, vol. Ed. 03, No. 44-49, pp. 27-30; 2003.

Bai et al., "Junction Termination Technique for Super Junction Devices;" 12th International Symposium on Power Semiconductor Devices and ICs, pp. 257-261; 2000.

Daniel et al.; "Modeling of the CoolMOS Transistor—Part I: Device Physics;" IEEE Transactions on Electron Devices, vol. 49, No. 5, pp. 916-922; May 2002.

Daniel, et al.; "Modeling of the CoolMOS Transistor—Part II: DC Model and Parameter Extraction;" IEEE Transactions on Electron Devices, vol. 49, No. 5, pp. 923-929; May 2002.

Mawby, PA; "MOS Devices;" IGDS Course, University of Wales Swansea; 2003.

\* cited by examiner

SUPERJUNCTION DEVICES HAVING NARROW SURFACE LAYOUT OF TERMINAL STRUCTURES, BURIED CONTACT REGIONS AND TRENCH GATES

CROSS REFERENCE TO RELATED APPLICATION

This application claims the benefit of U.S. Provisional Patent Application No. 61/620,635 filed Apr. 5, 2012, the entire disclosure of which is incorporated by reference herein.

BACKGROUND OF THE INVENTION

Embodiments of the present invention relate to a semiconductor device and a method for manufacturing the semiconductor device. In particular, embodiments of the present invention relate to superjunction semiconductor devices having narrow surface layout of terminal structures, buried contact regions and trench gates, and methods for manufacturing the devices.

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Figure 1:
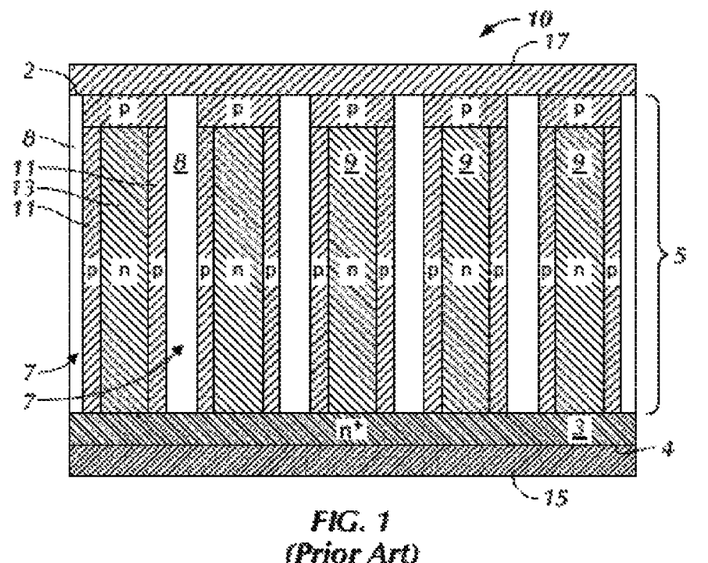
FIG. 1 is an enlarged partial cross-sectional view of a trench-type superjunction device according to the prior art.

Trench-type superjunction devices are expected to replace multi-epi superjunction devices because of the potential lower processing cost. FIG. 1 illustrates an enlarged partial cross-sectional view of a trench-type superjunction device that includes a semiconductor substrate 10 having a substrate region 3 and a semiconductor material layer 5 at two opposed surfaces 2, 4 of the semiconductor substrate. The semiconductor material layer 5 includes a plurality of trenches 7, which are filled with a semi-insulating material and/or an insulating material 8, and a plurality of mesas 9, each of which has alternating p and n columns 11 and 13, respectively.

Superjunction devices, including, but not limited to metal-oxide-semiconductor field-effect transistors (MOSFET), diodes, and insulated-gate bipolar transistors (IGBT), have been employed in various applications such as automobile electrical systems, power supplies, and power management applications. Such devices sustain high voltages in the off-state and yield low voltages and high saturation current densities in the on-state.

It is known that cell density is important for the performance of a semiconductor device. In the case of a low voltage MOSFET, cell density is directly related to the MOSFET channel density, and the channel density dominates the on-resistance of the MOSFET. In the case of high voltage devices, on-resistance is subject to the influence of the drift region, e.g., column 13 in FIG. 1. When a mesa/trench becomes narrower, channel density and drift region density increase. Because a trench acts as a "dead space", increasing channel density alone does not improve the on-resistance of the high voltage device. In addition, the narrower mesa of a high voltage device can be pinched off more readily.

In the case of high voltage superjunction devices, the mesas can be doped with increasing amounts of one or more dopants when mesa/trench width is narrowed. The increasing amounts of dopants allow the narrower mesas to sustain higher voltage without being pinched off. Therefore, the combination of increased cell density and increased doping concentration helps to reduce the on-resistance for a superjunction device, allowing the device to accommodate a higher density of current at high voltage. For example, in the case of the trench-type superjunction device illustrated in FIG. 1, the narrower the width of the mesas 9, the greater the number of the p and n columns 11, 13 per unit area, and the more current the device can accommodate. Therefore, for high voltage superjunction devices, it is desirable to reduce the width of the mesas 9 to pack as many p and n columns 11, 13 as possible per unit area. The same mechanism also applies to multiple epi superjunction devices.

Although narrower mesas can be readily achieved by adjusting the width of adjacent trenches and the diffusion process for the sidewall surfaces of the trenches during manufacture of a trench-type superjunction device, further reduction of the mesa width is restricted by the surface layout of the terminal structures for the device. Like most field-effect transistors (FETs), a superjunction semiconductor device can have four terminals, known as the gate, drain, source, and body/base, with the body and the source generally connected internally to simplify the design.

Figure 2:
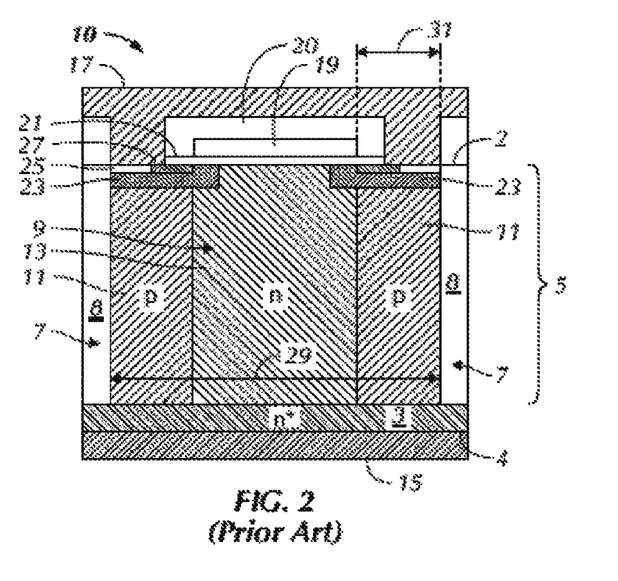
FIG. 2 is an enlarged partial cross-sectional view of a trench-type superjunction MOSFET having a unit cellular structure comprising pnp columns and a planar gate electrode according to the prior art.

FIG. 2 is an enlarged partial cross-sectional view of a trench-type superjunction MOSFET having a unit cellular structure comprising pnp columns and a planar gate electrode 19 according to the prior art. The unit cellular structure of semiconductor substrate 10 comprises two filled trenches 7 flanking a mesa 9, which comprises alternating p, n, and p columns 11, 13, and 11, respectively. The semiconductor substrate 10 is connected to a drain electrode 15 and a source electrode 17, and is adjacent to a planar gate electrode 19. The drain electrode 15, as shown, is connected to the substrate region 3 at the exposed main surface 4. The source electrode 17 and the gate electrode 19, as shown, are located proximate the opposed main surface 2. The source electrode 17 is connected to source regions 27 and body contact regions 25 at the main surface 2. The source regions 27 and body contact regions 25 are each laterally connected to one another and extend from the main surface 2 to a shallow depth in body regions 23. The source regions 27 and the body contact regions 25 are highly doped with opposite conductivity types, such as n and p-type, respectively, in order to reduce the contact resistance. The body regions 23, having a p-type conductivity type, are connected to the p columns 11, separating the source regions 27 from the n column 13, and proximate the planar gate electrode 19, which is disposed over the main surface 2 with a gate dielectric layer 21 interposed between.

It is readily apparent that the width 29 of the mesa 9 is restricted by factors such as the width of the planar gate electrode 19 and the lateral distance 31 between the gate electrode 19 and the source electrode 17. The lateral distance 31 is generally limited by the width of the source regions 27 and the width of the body contact regions 25. Ideally, self-aligned contact technologies have been used to form the electrical contacts between the semiconductor device and the terminals, such as the gate 19, the source 17, and the drain 15. Drastic reduction in the size of one or more terminal structures, such as the width of the gate electrode 19, the source regions 27, the body regions 23, and/or the body contact regions 25, can potentially impact the performance of the device. For example, when the channel density is increased by narrowing the width of the source regions 27 or the body contact regions 25, contact resistance is increased, resulting in parasitic npn turn-on, consequently destroying the device.

The width 29 of the mesa 9 can be further narrowed by reducing the width of the gate electrode 19, i.e., by using a trench gate. Instead of using a planar gate electrode as shown in FIG. 2, a trench gate 19 is disposed in a gate opening extending from main surface 2 into mesa 9 toward the main surface 4 to a shallow depth position. The gate opening is further filled with a gate dielectric that separates the gate electrode 19 from the n column 13, the source regions 27, and the body regions 23. Such trench gates structures can still suffer from operational drawbacks resulting from the narrowing.

Therefore, it is desirable to provide narrow surface layouts of the terminal structures for a superjunction semiconductor device that allow reduction of the column width, thus further increasing the current density, and a method for manufacturing such device.

BRIEF SUMMARY OF THE INVENTION

The present invention is directed, in general, to superjunction semiconductor devices having reduced column width and excellent performance, and including within the device, unit cells which comprise trench gate electrodes, buried body contact regions, and a gate dielectric having a thickness between a bottom of the gate electrode and the bottom of the gate trench which is greater than or equal to the width of the gate electrode. Various embodiments of the present invention thus provide high voltage semiconductor devices with low on-resistance, high breakdown voltage, and increased cell density. In the various embodiments of the present invention, a gate dielectric having a thickness between a bottom of the gate electrode and the bottom of the gate trench which is greater than or equal to the width of the gate electrode can allow the avoidance of a high electric field at the bottom oxide between a drain and the gate electrode, spreading the electric field and ensuring the electric field is controlled by the pn junction, not the bottom corner region of the gate.

One embodiment of the present invention includes superjunction semiconductor devices which comprise: (a) a column of a first conductivity type extending from a first main surface of a semiconductor substrate toward a second main surface of the semiconductor substrate opposed to the first main surface to a first depth position, and having a first concentration of a dopant of the first conductivity type; (b) a column of a second conductivity type opposite to the first conductivity type, having a second concentration of a dopant of the second conductivity type, and having a first sidewall surface proximate the column of the first conductivity type and a second sidewall surface opposed to the first sidewall surface; (c) a body contact region proximate the column of the second conductivity type, and having a third concentration of a dopant of the second conductivity type higher than the second concentration; (d) a source electrode connected to the body contact region at a body contact interface including at least a first side of the body contact region other than a portion of the first main surface; (e) a source region proximate the body contact region and the first main surface, the source region having a fourth concentration of a dopant of the first conductivity type higher than the first concentration, and connected to the source electrode at a source contact interface including at least a first side of the source region other than a portion of the first main surface; and (f) a trench gate electrode disposed in a gate opening extending from the first main surface toward the second main surface to a depth position shallower than the first depth position, the trench gate electrode having a width defined in a direction parallel to the first main surface of the semiconductor layer, the gate opening having one or more sidewall surfaces proximate the source region and the body region, and having a bottom proximate the column of the first conductivity type, and a dielectric layer interposed between the trench gate electrode and the one or more sidewall surfaces of the gate opening and between the trench gate electrode and the bottom of the gate opening; the dielectric layer having a thickness between the trench gate electrode and a bottom surface of the gate opening greater than or equal to the width of the trench gate electrode.

Another embodiment of the present invention includes methods of manufacturing a superjunction semiconductor device, wherein the methods comprise:

(a) providing a semiconductor substrate having first and second main surfaces opposite to each other, the semiconductor substrate having a heavily doped region of a first conductivity type proximate the second main surface and having a lightly doped region of the first conductivity type proximate the first main surface;

(b) forming in the semiconductor substrate a column of the first conductivity type having a first concentration of a dopant of the first conductivity type, and a column of a second conductivity type opposite to the first conductivity type having a second concentration of a dopant of the second conductivity type, the column of the second conductivity type having a first sidewall surface proximate the column of the first conductivity type and a second sidewall surface opposed to the first sidewall surface, both columns extending from the first main surface toward the heavily doped region to a first depth position;

(c) forming a body contact region proximate the column of the second conductivity type and having a third concentration of a dopant of the second conductivity type higher than the second concentration;

(d) forming a source electrode connected to the body contact region at a body contact interface including at least a first side of the body contact region other than a portion of the first main surface;

(e) forming a source region proximate the body contact region and the first main surface, the source region having a fourth concentration of a dopant of the first conductivity type higher than the first concentration and being connected to the source electrode at a source contact interface including at least a first side of the source region other than a portion of the first main surface;

(f) forming a body region proximate the column of the second conductivity type, the body contact region, and the source region, the body region having a fifth concentration of a dopant of the second conductivity type higher than the second concentration, but lower than the third concentration;

(g) forming a gate opening extending from the first main surface toward the second main surface to a depth position shallower than the first depth position, the gate opening having one or more sidewall surfaces proximate the source region and the body region, and a bottom proximate the column of the first conductivity type;

(h) forming a dielectric layer in the gate opening; and (i) forming a trench gate electrode in the gate opening such that the trench gate electrode is separated from the column of the first conductivity type, the body region, and the source region by the dielectric layer, the trench gate electrode having a width defined in a direction parallel to the first main surface of the semiconductor layer, and wherein the dielectric layer has a thickness between the trench gate electrode and a bottom surface of the gate opening greater than or equal to the width of the trench gate electrode.

In various preferred embodiments of the present invention, the column of the first conductivity type and the column of the second conductivity type comprise epitaxial layers. Various preferred method embodiments according to the present invention include methods wherein providing the semiconductor substrate and forming the column of the first conductivity type and the column of the second conductivity type comprises depositing an epitaxial layer.

In various preferred embodiments of the present invention, the dielectric layer has a thickness between the trench gate electrode and a bottom surface of the gate opening greater than the width of the trench gate electrode. In various preferred embodiments of the present invention, the gate electrode has a bottom region which is tapered and/or rounded.

Other aspects, features and advantages will be apparent from the following disclosure, including the detailed description, preferred embodiments, and the appended claims.

BRIEF DESCRIPTION OF SEVERAL VIEWS OF THE DRAWINGS

The foregoing summary, as well as the following detailed description of preferred embodiments of the invention, will be better understood when read in conjunction with the appended drawings. For purposes of illustration the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

As used herein, the singular terms "a" and "the" are synonymous and used interchangeably with "one or more" and "at least one," unless the language and/or context clearly indicates otherwise. Accordingly, for example, reference to "a solvent" or "the solvent" herein or in the appended claims can refer to a single solvent or more than one solvent. Additionally, all numerical values, unless otherwise specifically noted, are understood to be modified by the word "about."

For simplicity and clarity of illustration, elements in the figures are not necessarily to scale, and the same reference numbers in different figures denote the same elements. For clarity of the drawing, devices, trenches, mesas, and the doped regions of device structures are illustrated as having generally straight line edges and precise angular corners. However, those skilled in the art understand that the edges need not be straight lines and the corners need not be precise angles.

Certain terminology is used in the following description for convenience only and is not limiting. The words "right", "left", "lower", and "upper" designate directions in the drawing to which reference is made. The words "inwardly" and "outwardly" refer direction toward and away from, respectively, the geometric center of the object described and designated parts thereof. The terminology includes the words above specifically mentioned, derivatives thereof and words of similar import. Additionally, it must be noted that as used herein and in the appended claims, the singular forms "a," "an," and "the" include plural reference unless the context clearly dictates otherwise.

Although any embodiment may refer to a particular conductivity (e.g., p-type or n-type), it will be readily understood by those skilled in the art that p-type conductivity can be switched with n-type conductivity and vice versa and the device will still be functionally correct (i.e., a first or second conductivity type). For example, MOSFET-gated devices and IGBTs can be fabricated in an epitaxial wafer with an n-type epitaxial layer over a $p^+$ substrate (or vice versa).

An n-type semiconductor includes any semiconductor obtained by n-type doping process, i.e., by adding an impurity (dopant) to a semiconductor, in order to increase the number of free electrons in the material. For example, an n-type semiconductor can be obtained by incorporating phosphorus (P), arsenic (As), or antimony (Sb), into silicon. The n-type semiconductor can be heavily doped ($n^+$), very heavily doped ($n^{++}$), lightly doped ($n^-$), or very lightly doped ($n^{--}$). The level of doping of the n-type semiconductor is directly proportional to the carrier concentration.

A p-type semiconductor includes any semiconductor obtained by p-type doping process, i.e., by adding an impurity (dopant) to a semiconductor, in order to increase the number of free holes in the material. For example, a p-type semiconductor can be obtained by incorporating boron (B) or aluminum (Al) into silicon. The p-type semiconductor can be heavily doped ($p^+$), very heavily doped ($p^{++}$), lightly doped ($p^-$), or very lightly doped ($p^{--}$). The level of doping of the p-type semiconductor is directly proportional to the carrier concentration.

Doping in accordance with various embodiments of the present invention can be carried out using any method or equipment known or to be developed for imparting impurities of either n-type or p-type into another material, including, for example, ion implantation and in-situ vapor deposition techniques.

The semiconductor device according to preferred embodiments can embody either a cellular design (where the body regions are a plurality of cellular regions) or a single body design (where the body region is compromised of a single region formed in an elongated pattern, typically in a serpentine pattern). Although the device will be described as a cellular design throughout the following description for ease of understanding, it should be understood that it is intended that embodiments of the present invention encompass a cellular design, a single body design, or a combination thereof. By way of example, a device according to certain preferred embodiments is among many such devices integrated with logic and/or other components into a semiconductor chip as part of a power integrated circuit. Alternatively, a device according to certain other preferred embodiments is among many such devices integrated together to form a discrete transistor device.

As used herein, the term "terminal structure" refers to a structure that contains any one or more of the structures involved in a terminal for a semiconductor device. The "terminal structure" can be, for example, an electrode that is connected to the semiconductor device, e.g., a gate electrode, a source electrode, a drain electrode, or a body/base/bulk electrode, connected to a field-effect transistor (FET). The gate electrode may be thought of as controlling the opening and closing of a physical gate. This gate permits electrons to flow through or blocks their passage. Electrons flow from the source electrode toward the drain electrode if influenced by an applied voltage. The body contains the bulk of the semiconductor in which the gate, source and drain electrodes are connected. Usually the body electrode is connected to the highest or lowest voltage within the circuit, depending on-type. The source electrode is also sometimes connected to the highest or lowest voltage within the circuit. Therefore, the body electrode and the source electrode are sometimes connected together. The "terminal structure" can also be, for example, a doped region in the semiconductor substrate that is in close proximity or adjacent to an electrode connected to the semiconductor device. Examples of such doped regions, include, but are not limited to, a body/base/bulk region, a body contact region, or a source region for a FET. Examples of terminal structures further include base, collector and emitter for a bipolar junction transistor (BJT). The "terminal structure" can be a combination of any one or more of the electrodes and the doped regions for a FET, or a combination of any one or more of the base, collector and emitter for a BJT.

In one embodiment, the "terminal structure" includes a gate electrode, a body region, a body contact region, a source region, and a source electrode for a superjunction MOSFET. In another embodiment, the "terminal structure" includes a body contact region and a source electrode for a superjunction diode.

As used herein, the term "high voltage semiconductor device" refers to a semiconductor device that is able to sustain high reverse-bias voltage in the off-state, and carry a large amount of current and yield low voltage in the on-state. A high voltage semiconductor device can accommodate a higher current density, higher power dissipation, and/or higher reverse breakdown voltage than a regular semiconductor device.

As used herein, the term "power semiconductor device" refers to a semiconductor device that is able to carry a larger amount of energy. A power semiconductor device typically is able to support a larger reverse-bias voltage in the off-state. A power semiconductor device can be a high voltage semiconductor device. However, a power semiconductor device can also be a low voltage device, such as an integrated power device. The term "power semiconductor device" may include a high voltage discrete device, a low voltage discrete device, a high voltage integrated circuit (IC), and a low voltage IC. Power devices can be used as switches or rectifiers in power electronic circuits, such as switch mode power supplies. Examples of power semiconductor devices include, but are not limited to, a superjunction MOSFET, a superjunction MESFET, a superjunction Schottky transistor, a superjunction IGBT, a thyristor, and a superjunction diode.

The superjunction semiconductor devices according to preferred embodiments include high voltage semiconductor devices and power semiconductor devices.

High voltage or power semiconductor devices can be built using any structure that is optimized for the desired property of the device. For example, vertical or trench type MOSFETs can be made with an $n^+$ substrate and $n^-$ epitaxial layer to minimize series resistance at the n region. IGBTs can be made with a similar $n^+$ substrate and $n^-$ epitaxial layer. IGBTs can also be made with $n^-$ substrates only, because IGBTs does not need low series resistance but needs high conductivity modulation by high efficiency electron and hole injection. Lateral structures, such as n-epitaxial layers on p substrates or p substrates only with or without n diffused layers can also be used for a high voltage or power semiconductor device.

Figure 3:
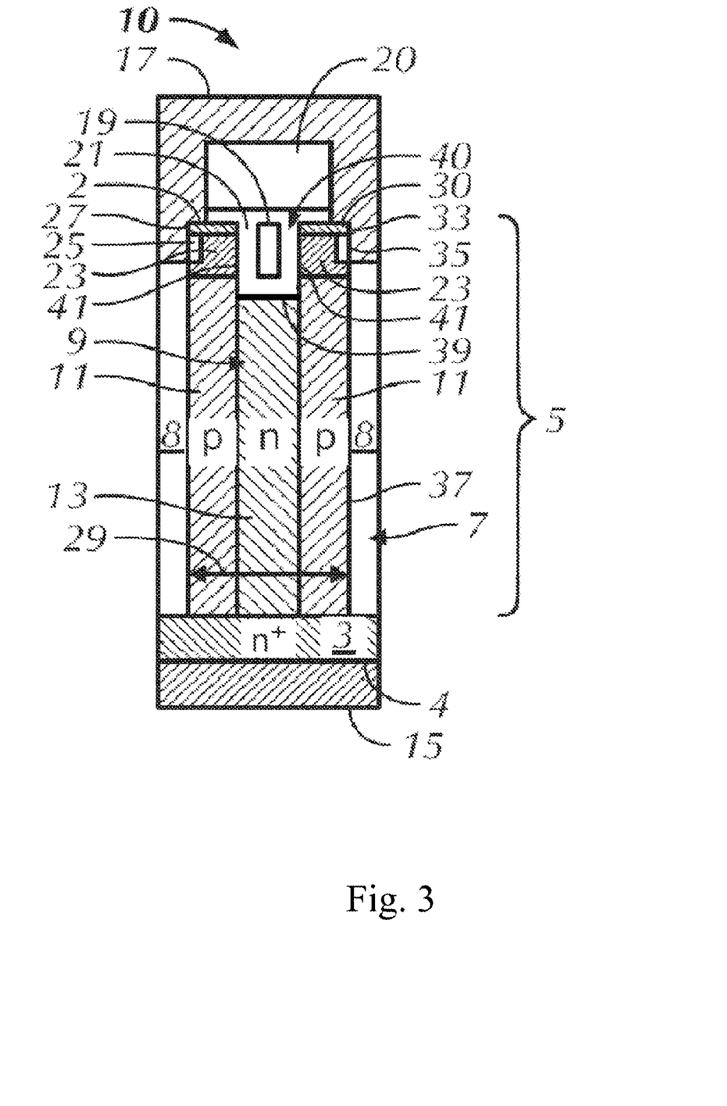
FIG. 3 is an enlarged partial cross-sectional view of a trench-type superjunction MOSFET having a unit cellular structure comprising pnp columns and a trench gate electrode according to a preferred embodiment of the present invention.

FIG. 3 shows a trench-type superjunction MOSFET having a semiconductor substrate 10, which has a unit cellular structure including two filled trenches 7 flanking a mesa 9. The mesa 9 includes alternating p, n, and p columns, 11, 13, and 11, respectively. The semiconductor substrate 10 is connected to a drain electrode 15 at the main surface 4, and a source electrode 17 and a gate electrode 19 proximate the opposite main surface 2. The source electrode 17 is connected to each source region 27 at a source contact interface including a side 33 and a portion of a side 30. Sides 30 are at the first main surface 2 and sides 33 are in alignment with sidewall surfaces 37 of the p columns 11. The source electrode 17 is also connected to each body contact region 25 at a body contact interface including a side 35. Sides 35 are in alignment with the sidewall surfaces 37 of the p columns 11. The source regions 27 and the body contact regions 25 are highly doped with opposite conductivity types, for example, n and p-types, respectively. The body regions 23 are doped with a p-type dopant at a concentration higher than the p-type dopant concentration in the p columns 11 but lower than the p-type dopant concentration in the body contact regions 25. The body regions 23 are located proximate the p columns 11, separate the n column 13 from the source regions 27, and are in close proximity to the planar gate 19 disposed over the main surface 2 with a gate dielectric layer 21 interposed between.

Because the body contact regions are buried, the width of the columns 11 is limited only by the width of the source region 27 and is no longer limited by the width of the body contact region 25, thus a narrower width 29 of the mesa 9 is achieved. The width 29 of the mesa 9 is further narrowed by reducing the width of the gate electrode 19, by using a trench gate, as shown in FIG. 3. A trench gate 19 is disposed in a gate opening 40 extending from main surface 2 toward the main surface 4 to a shallow depth position. The gate opening 40 has a bottom 39 proximate the column 13 and first and second sidewall surfaces 41 each including a side of the source region 27 and a side of the body region 23. The gate opening 40 is further filled with a gate dielectric 21 that separates the gate electrode 19 from the n column 13, the source regions 27, and the body regions 23.

Figure 3A:
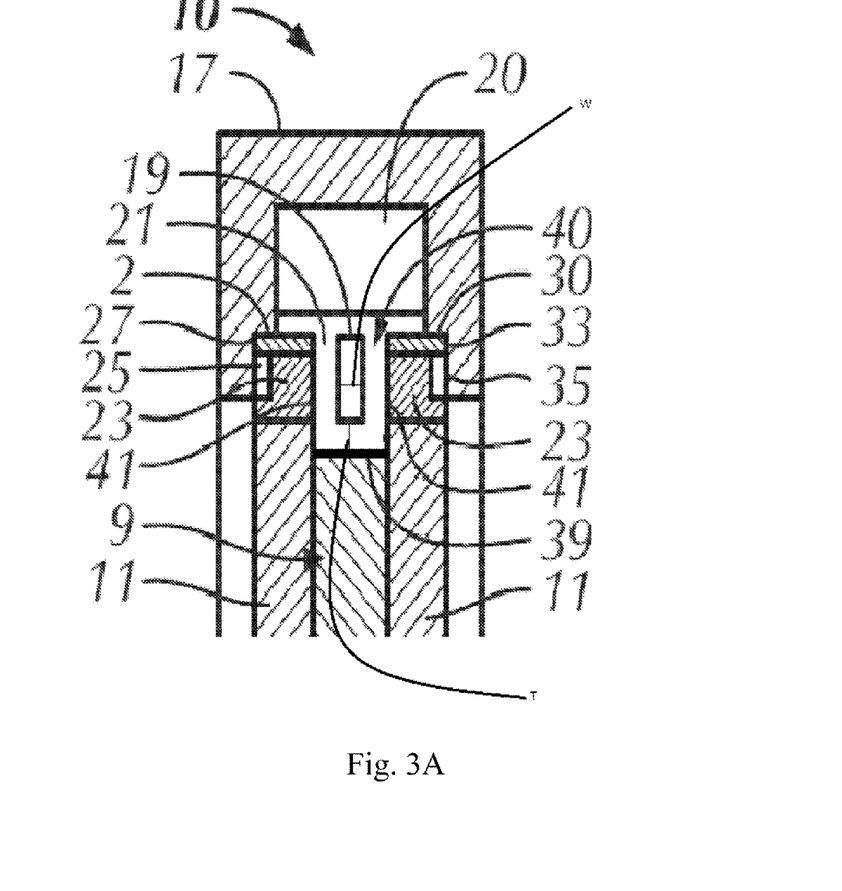
FIG. 3A is a further enlarged section of the upper portion of the device shown in FIG. 3.

In accordance with the various embodiments of the invention, as depicted for example in FIG. 3A, the thickness (T) of the gate dielectric, in a direction perpendicular to mesa width 29, between a bottom edge of the trench gate 19 and the bottom of the gate opening 39 is greater than or equal to the width (W) of the gate electrode 19. In various preferred embodiments of the present invention, the thickness (T) of the gate dielectric is twice the width of the gate electrode 19 or more. In various even more preferred embodiments of the invention, the thickness (T) of the gate dielectric is three times the width of the gate electrode 19 or more. This gate dielectric thickness (T) to width (W) of gate electrode 19 ratio applies to the various embodiments depicted in the additional Figures but is not specifically indicated in each Figure with a "T" and a "W".

In accordance with various preferred embodiments of the present invention, the gate dielectric 21 proximate the bottom 39 of the gate opening is deposited or contoured to be concave. In accordance with various preferred embodiments of the present invention, the gate electrode 19 is tapered or rounded at a bottom region of the gate electrode 19. In various preferred embodiments of the present invention, the gate dielectric 21 proximate the bottom 39 of the gate opening is deposited or contoured to be concave and the gate electrode 19 is tapered or rounded in a complimentary fashion at a bottom region of the gate electrode 19.

Figure 4:
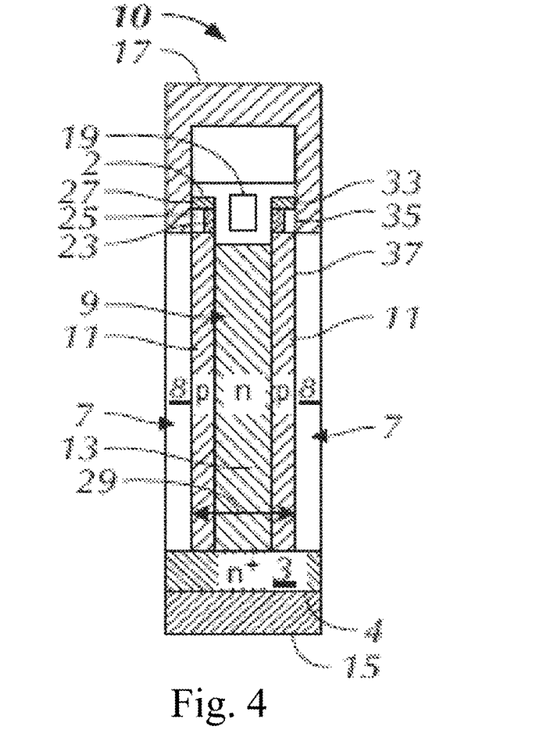
FIG. 4 is an enlarged partial cross-sectional view of a trench-type superjunction MOSFET having a unit cellular structure comprising pnp columns, a trench gate electrode, and a source contact interface not including a portion of the main substrate surface according to a preferred embodiment of the present invention.

The width 29 of the mesa 9 shown in FIG. 3 is restricted by factors such as the width of the trench gate 19 and the width of the source region 27. The width 29 of the mesa 9 can be additionally narrowed by restricting the source contact interface to one or more sides of the source regions 27 not at the main substrate surface 2, as illustrated in FIG. 4. The source electrode 17 is connected to each source region 27 at a source contact interface including only the sides 33, not any portion of the main substrate surface 2.

Figure 5:
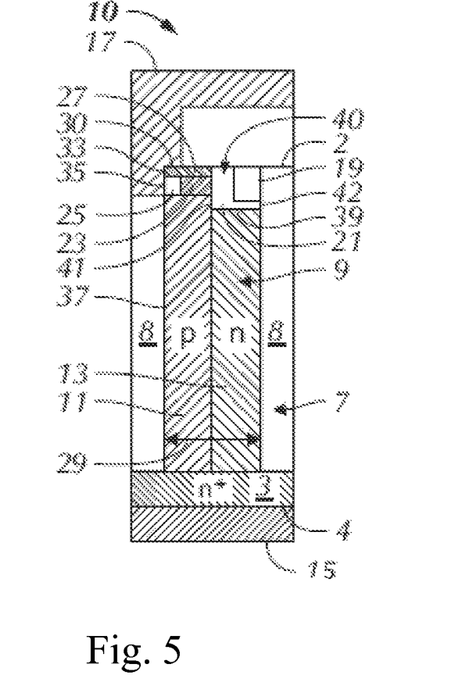
FIG. 5 is an enlarged partial cross-sectional view of a trench-type superjunction MOSFET having a unit cellular structure comprising pn columns and a trench gate electrode according to a preferred embodiment of the present invention.
Figure 6:
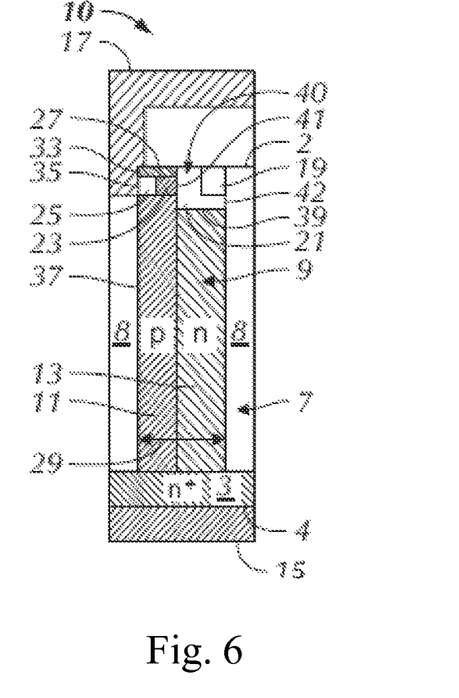
FIG. 6 is an enlarged partial cross-sectional view of a trench-type superjunction MOSFET having a unit cellular structure comprising pn columns, a trench gate electrode, and a source contact interface not including a portion of the main substrate surface according to a preferred embodiment of the present invention.

FIGS. 5-6 illustrate trench-type superjunction MOSFET devices having a unit cellular structure comprising pn columns according to preferred embodiments of the present invention. The surface layouts of the terminal structures in FIGS. 5-6 are similar to the surface layouts of the terminal structures described above for the devices shown in FIGS. 3-4, respectively. Because the unit cellular structure has only one p column 11, body contact region 25, source region 27, and body region 23, rather than two of each, the gate opening 40, shown in FIGS. 5 and 6, has a second sidewall surface 42 proximate the right side filled trench 7.

Figure 7:
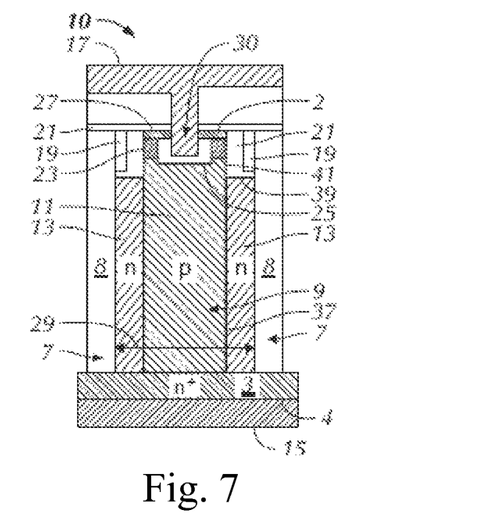
FIG. 7 is an enlarged partial cross-sectional view of a trench-type superjunction MOSFET having a unit cellular structure comprising npn columns and a trench gate electrode according to a preferred embodiment of the present invention.

FIG. 7 illustrates a preferred embodiment wherein a trench-type superjunction MOSFET has a unit cellular structure including npn columns and trench gate electrodes 19 formed similarly as described above for the device of FIG. 6. Because the p column 11 is interposed between two n columns 13 in the unit cellular structure, the source electrode 17 is connected to the source region 27 and the body contact region 25 in a source opening 30 between the two n columns 13. The source opening 30 extends from the main surface 2 toward the main surface 4 to a shallow depth position. The source electrode 17 forms contacts with the source regions 27 and the body contact region 25 at the sidewall surfaces and the bottom of the source opening 30. As shown, the sidewall surfaces of the source opening 30, and thus, the source contact interfaces 33 and portions of the body contact interfaces 35, are parallel to the sidewall surface 37 of the p column 11.

Figure 8:
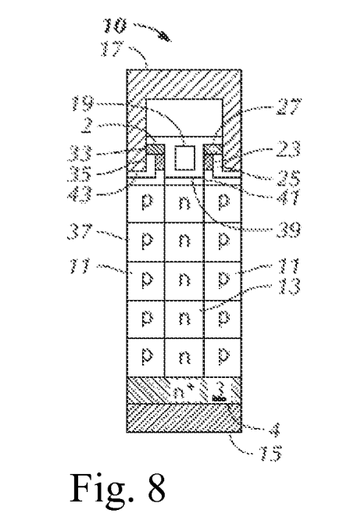
FIG. 8 is an enlarged partial cross-sectional view of a trench-type superjunction MOSFET having a unit cellular structure comprising pnp columns and a trench gate electrode according to a preferred embodiment of the present invention.

FIG. 8 illustrates a preferred embodiment of the present invention that relates to an epi-type superjunction MOSFET having a trench gate electrode 19, wherein the source electrode 17 forms contact with the source regions 27 at source contact interfaces including sides 33, which are sides of each of the source regions 27, shown parallel to the sidewall surfaces 37 of the p columns 11. The source electrode 17 also forms contact with the body contact regions 25 at body contact interfaces including sides 43 of the body contact regions 25, shown parallel to the main surface 2, and sides 35 of the body contact region 25 as shown parallel to the sidewall surfaces 37 of the p columns 11.

Certain embodiments include an epi-type superjunction MOSFET having other designs of the unit cellular structure, such as those including pn columns or npn columns. Such epi-type superjunction MOSFET devices can be made and used according to the description herein.

In the drawings, sides 33 and sides 35 are shown to be in alignment with or parallel to the sidewall surfaces 37 of the p columns 11. Preferred embodiments include semiconductor devices having a source contact interface including any side of the source region 27 other than one at or parallel to the first main surface 2. Preferred embodiments also include semiconductor devices having a body contact interface including any side of the body contact region 25 other than one at or parallel to the first main surface 2.

In another general aspect, embodiments of the present invention also provide methods of manufacturing a semiconductor device.

The semiconductor devices provided in accordance with preferred embodiments can be manufactured by epi-type growth of semiconductor layers. For example, referring to FIG. 8, alternating p and n columns 11, 13 can be formed by growing multiple thin n-type epitaxial layers and implanting each epitaxial layer with boron to form the p regions prior to growing the next epitaxial layers. The terminal structures can be formed using methods similar to those described below for the trench-type processes. The epi-type fabrication process generally requires many processing steps and aligning the p and n columns 11, 13 within each epitaxial layer can be difficult and costly.

In a preferred embodiment, the semiconductor devices can be manufactured by trench-type processes. Examples of trench-type manufacturing of the superjunction devices have been described in U.S. Pat. No. 6,982,193, U.S. Pat. No. 7,015,104, and U.S. Pat. No. 7,052,982, etc., which are hereby incorporated by reference.

An exemplary trench-type manufacturing process is discussed below referring to FIG. 3.

A semiconductor substrate 10 having two main surfaces 2 and 4 opposite to each other is provided. The semiconductor substrate 10 includes a substrate region 3 proximate surface 4 and a semiconductor material layer 5 including surface 2. Suitable semiconductor substrate materials include, but are not limited to, various semiconducting materials such as silicon, germanium, arsenides, antimonides and/or phosphides of gallium and/or indium, and combinations thereof.

In various embodiments, the semiconductor substrate 10 may be a silicon wafer. Silicon wafers can be prepared via standard techniques to prepare a suitable substrate. For example, suitable wafers can be prepared via a process wherein silicon is grown from a small crystal, called the seed crystal, rotated and slowly withdrawn from molten hyperpure silicon to give a cylindrical crystal, which is then sliced to obtain thin disks, which after slicing, are finely ground, mirror-smooth polished, and cleaned. Suitable silicon wafers can be undoped, or doped with either p-type or n-type conductivity, either heavily or lightly.

In certain preferred embodiments, the substrate region 3 and the semiconductor material layer 5 are both doped with a dopant of the same conductivity type. Generally, the substrate region 3 is doped at a level greater than the semiconductor material layer 5. For example, in embodiments wherein the substrate region 3 is a silicon wafer doped with n-type conductivity and the semiconductor material layer 5 is epitaxial silicon which is lightly n-type doped, the level of doping in the substrate region 3 can be about $1 \times 10^{17}$ cm$^{-3}$ to about $1 \times 10^{20}$ cm$^{-3}$, and the level of doping in the semiconductor material layer 5 can be about $1 \times 10^{13}$ cm$^{-3}$ to about $1 \times 10^{19}$ cm$^{-3}$. In preferred embodiments, the level of doping in the semiconductor material layer 5 can be about $1 \times 10^{13}$ to about $1\times10^{19}$, about $1\times10^{13}$ to about $1\times10^{18}$, about $1\times10^{13}$ to about $1\times10^{17}$, about $1\times10^{13}$ to about $1\times10^{16}$, about $1\times10^{13}$ to about $1\times10^{15}$, or about $1\times10^{13}$ to about $1\times10^{14}$ cm$^{-3}$.

The doping level of layer 5 is preferably equal to or lower than the doping level in the p column 11 and the n column 13. Based on the theory of superjunction, doping level of the center column, e.g., 13 in FIG. 3, is to have approximately about $2\times10^{12}$ cm$^{-2}$ integrated concentration for the lateral direction, and each column at the right and left side of the center column, e.g., 11 in FIG. 3, is to have approximately about $1\times10^{12}$ cm$^{-2}$ integrated concentration for the lateral direction. The integrated concentration for the lateral direction is calculated by the doping concentration (cm$^{-3}$)×width (cm), wherein the width is the actual width of the column p (11) or n (13). Therefore, narrower p or n column 11, 13 width allows higher doping concentration of the column, thereby resulting in lower on-resistance.

For example, for an n column 13 having a width of about 10 μm, the doping concentration is to be $2\times10^{15}$ cm$^{-3}$ (10 μm×2× $10^{15}$ cm$^{-3}$=$2\times10^{12}$ cm$^{-2}$). When the n column is narrowed, e.g., to have a width of about 1 μm, the doping concentration is to be $2\times10^{16}$ cm$^{-3}$. If the width of the n column 13 is further narrowed to about 0.1 μm, the doping concentration can be of $2\times10^{17}$ cm$^{-3}$. Theoretically, a column width of 1 nm allows a doping concentration of $2\times10^{19}$ cm$^{-3}$. Therefore, the column width of a superjunction device according to embodiments of the invention is only limited by manufacturing techniques. High doping levels in a column can be achieved, for example, by growing epitaxial layer on the substrate, followed by doping and diffusion.

In certain preferred embodiments, the semiconductor material layer 5 is epitaxial silicon, which refers to single crystal silicon grown over a substrate, usually via chemical vapor deposition (CVD). Epitaxially grown silicon deposited using CVD can be doped during formation with a high degree of control. Accordingly, lightly doped silicon 5 can be deposited over a silicon substrate 3. In certain embodiments, the semiconductor layer 5 is epitaxial silicon doped with a dopant of a first conductivity, such as n-type conductivity, at a level of about $1\times10^{13}$ cm$^{-3}$ to about $1\times10^{19}$ cm$^{-3}$. In certain preferred embodiments according to the present invention, the semiconductor layer 5 comprises epitaxial silicon doped with n-type conductivity at a level of about $2\times10^{15}$ cm$^{-3}$ to about $2\times10^{17}$ cm$^{-3}$. Any suitable epitaxial deposition apparatus known or to be developed can be used to form a suitable epitaxial semiconductor material layer 5. The height of the semiconductor substrate 10 determines the voltage blocking capability of a trench-type superjunction semiconductor. The thickness of layer 5 is increased or decreased depending on the desired breakdown voltage rating of the device. Devices with higher desired breakdown voltage require thicker epitaxial layer. In an exemplary embodiment, for a device having about 600V breakdown voltage, layer 5 has a thickness on the order of about 40-50 microns.

One or more trenches 7 are formed in layer 5 extending from the main surface 2 to touch, to approach, or to penetrate the interface 6 between the heavily doped n$^+$ region 3 and the material layer 5. Note however, trenches 7 are not required to touch or to approach the interface 6. Trenches 7 may be formed only in layer 5 extending from the main surface 2 to any depth position desirable, including penetrating layer 5 and reaching into substrate 3. Each of the trenches 7 is adjacent to an adjoining mesa 9. Many geometrical arrangements of trenches 7 and mesas 9 (i.e., in plan view) are contemplated without departing from embodiments of the present invention. The shape of the trenches 7 is not limited to being rectangular. Many other possible trench shapes such as dog-bones, rectangles with rounded ends, or crosses are also possible. The number and locations of the trenches 7 may affect overall device efficiency.

Preferably, the trenches 7 are formed by utilizing known techniques such as plasma etching, reactive ion etching (RIE), sputter etching, vapor phase etching, chemical etching, deep RIE or the like. Utilizing deep RIE, trenches 7 can be formed having depths of about 40 μm to about 300 μm or even deeper. Deep RIE technology permits deeper trenches 7 with straighter sidewalls. Furthermore, forming deeper trenches 7 that have straighter sidewalls than conventionally etched or formed trenches 7, in addition to other steps in the process, results in a final superjunction device with enhanced avalanche breakdown voltage ($V_b$) characteristics as compared to conventional semiconductor-transistor devices (i.e., the avalanche breakdown voltage ($V_b$) can be increased to about 200 to 1200 Volts or more).

The sidewalls of each trench 7 can be smoothed, if needed, using, for example, one or more of the following process steps: (i) an isotropic plasma etch may be used to remove a thin layer of silicon (typically 100-1000 Angstroms) from the trench surfaces or (ii) a sacrificial silicon dioxide layer may be grown on the surfaces of the trench and then removed using an etch such as a buffered oxide etch or a diluted hydrofluoric (HF) acid etch. The use of the smoothing techniques can produce smooth trench surfaces with rounded corners while removing residual stress and unwanted contaminates. However, in embodiments where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

First and second sidewall surfaces 37 of the mesa 9 in about parallel alignment with each other are implanted or doped with a p dopant such as boron (P) using any techniques known in the art. Preferably, the implants are performed without benefits of a masking step, e.g., at an implantation angle Φ determined by the width and the depth of the trenches 7, at a high energy level in the range of about 40 Kilo-electron-volts (KeV) to several Mega-eV. Preferably, the energy level is in the range of about 200 KeV to 1 MeV, but it should be recognized that the energy level should be selected to sufficiently implant the dopant. The use of the predetermined implantation angle φ ensures that only the sidewall surfaces 37 of the mesa 9 and not the bottoms of the trench 7 are implanted. The implantation angle φ can be between about 2° and 12° from vertical and is preferably about 4°.

Though not shown clearly, in some embodiments the trenches 7 are preferably slightly wider at their tops by about 1%-10% than at their bottoms to facilitate the trench fill process when the trenches 7, for example, are to be filled with grown oxide. Consequently, each sidewall surface 37 has a predetermined inclination maintained relative to the first main surface 2. The inclinations of the first and the second sidewall surfaces 37 are about the same depending on tolerances of the etching process. Other doping techniques may be utilized.

Following implanting the p-type implant on both sidewall surfaces 37, a drive-in step (i.e., a diffusion) is performed using any known techniques to create p-type doped regions or p columns 11 proximate the sidewall surfaces 37. Preferably, a temperature and a time period for the drive-in step are selected to sufficiently drive in the implanted dopant into the mesa 9. In an exemplary embodiment, the drive-in step (i.e., a diffusion) is performed at a temperature of up to about 1200° Celsius for up to about 24 hours. In another embodiment of the present invention, the drive-in step is performed at about 1150-1200° C. for about 1-2 hours. After the drive-in step, the mesa 9 adjacent to two trenches 7 is converted to include the p column 11, the n column 13, and the p column 11, with the sidewall surface 37 as a first sidewall surface for p columns 11. Each p column 11 has a second sidewall surface opposed to sidewall surface 37 proximate the n column 13. The n columns 13 have the same carrier concentration as that of layer 5.

In another exemplary embodiment (not shown in FIG. 3), when the doping concentration in the n-epitaxial layer 5 is less than required, e.g., to achieve an integrated concentration for the lateral direction of about $2 \times 10^{12}$ cm$^{-2}$, n-type implantation or doping, followed by drive-in can be performed before p-type doping, but after the step of trench 7 etching. The sidewall surfaces 37 are doped with an n-type dopant at a carrier concentration higher than that of layer 5 using a method similar to that described above. A diffusion step is performed at about 1150-1200° C. for about 15-20 hours. The sidewall surfaces 37 are further doped with a p-type dopant, followed by a diffusion step performed at about 1150-1200° C. for about 1-2 hours. According to this embodiment, the n column 13 comprises higher carrier concentration than the carrier concentration in the layer 5.

An oxidation step, usually performed in a steam or oxygen ambient, can also be performed with or subsequent to the drive-in step, which forms a silicon dioxide layer (not shown) on the sidewalls 37 and the bottoms of the trenches 7. A thin layer of silicon nitride (not shown) can also be deposited on the sidewalls 37 and the bottoms of the trenches 7. Deposition of silicon nitride on thermally oxidized silicon wafers does not influence the fundamental properties of the Si—SiO$_2$ interface. The existence of silicon nitride makes surface potential stable or unstable according to the structures, partly due to the existence of hydrogen in silicon nitride. Hydrogen can influence electric properties. The layer of silicon nitride also serves the function to isolate and protect the silicon and silicon oxide in the pnp columns from the refill material to be filled in trenches 7.

The lining of the trenches 7 with silicon nitride can be performed in general by CVD (thermal or plasma). The lining of the trenches 7 with silicon dioxide can be performed in general by CVD (thermal, plasma, or spun-on-glass (SOG)). The lining of the trenches 7 with silicon dioxide and/or silicon nitride is preferably performed by applying tetraethylorthosilicate (TEOS) because of the better conformity achieved by TEOS. Preferably, the silicon nitride is about 100 Å to about 10,000 Å thick (1 μm=10,000 Å).

The trenches 7 are then filled with a material 8 such as a semi-insulating material, an insulating material, or a combination thereof. In exemplary embodiments, the material 8 can be a polysilicon, a re-crystallized polysilicon, a single crystal silicon, or a semi-insulating polycrystalline silicon (SIPOS), filled into the trenches 7 using a SOG technique. For example, the trenches 7 can be refilled with SIPOS 190. The amount of oxygen content in the SIPOS is selectively chosen to be between 2% and 80% to improve the electrical characteristics of the active region. Increasing the amount of oxygen content is desirable for electrical characteristics, but varying the oxygen content also results in altered material properties. Higher oxygen content SIPOS will thermally expand and contract differently than the surrounding silicon which may lead to undesirable fracturing or cracking especially near the interface of differing materials. Accordingly, the oxygen content of the SIPOS is optimally selected to achieve the most desirable electrical characteristics without an undesirable impact on mechanical properties.

During the refill process, a top layer of the fill material 8 is often also deposited over the top surface of the pnp columns, 11, 13, 11 proximate the main surface 2. In order to create the semiconductor device features for a transistor to be formed thereon, the pnp columns 11, 13, 11 must be exposed. In some embodiments, planarization by chemical mechanical polishing (CMP) or other techniques known in the art can be performed so as to sufficiently expose the pnp columns 11, 13, 11, but to avoid opening any internal voids in the fill material 8 that may have occurred during the fill process. Preferably, the planarization is about 1.0-1.5 μm.

For trench gate electrode 19, such as in the device shown in FIG. 3, gate openings 40 are first formed by removing the edge portions of the semiconductor substrate proximate the main surface 2 using techniques such as self-aligning silicon etching and slight silicon wet etching. Each gate opening 40 is generally between two p columns 11 and within the n column 13. A gate dielectric layer 21 is either grown or deposited on the sidewall surfaces 41 and the bottom 39 of the gate opening 40. Trench gate electrodes 19 are formed over the gate dielectric layer 21 within the gate opening 40. The minimum width of the trench gate 19 is only limited by manufacturing techniques. A gate 19 made of a material having lower electrical resistance, such as a silicide or a metal, can have narrower width than a gate 19 made of a material having higher electrical resistance, such as polysilicon. In preferred embodiments, the gate width is about 0.2 microns to about 1 microns.

Gate opening 40 can be obtained by either self-aligning or non-self-aligning method known to a person skilled in the art. When mesa 9 width becomes small, self-aligning method is preferred. The thickness (T) of the gate dielectric layer 21 at a bottom region of gate opening 40 is equal to or greater than the width (W) of the gate electrode 19. In an exemplary embodiment according to the present invention, a gate dielectric layer 21 having a thick bottom such that the recited (T):(W) ratio is satisfied can be formed by first forming gate opening (trench) 40, optionally and preferably with smoothing of the trench sidewalls. After the trench is formed, a thin oxide layer is deposited on the sidewalls and bottom of the trench as a pad for silicon nitride deposition. A thin layer of silicon nitride is then deposited (e.g., via CVD) on the thin oxide layer on the sidewalls and bottom of the trench. The silicon nitride is then selectively removed (e.g., by reactive-ion etching (RIE)) from the trench bottom, but allowed to remain on the trench sidewalls. An oxide layer of desired thickness is then formed on the trench bottom (oxide growth on the trench sidewalls is prevented by the silicon nitride which remains). The silicon nitride is then removed from the trench sidewalls. Rounding of the thick bottom oxide can be accomplished by further etching.

In an exemplary embodiment, the thickness of the gate 19 can be about 0.05 micron to about 1 micron. In another embodiment, for a high voltage such as 600 V, the gate thickness 19 can be about 0.05 micron to about 0.1 micron. In preferred embodiments, the gate dielectric layer 21 may be silicon dioxide, silicon oxynitride, silicon nitride, tantalum pentoxide, titanium dioxide, barium strontium titanate, combinations thereof, or any other materials that have good dielectric activity. The trench gate electrode 19 can be made of, for example, a layer of metal, silicide, doped or undoped polysilicon, amorphous silicon, or a combination thereof. In an exemplary embodiment, the trench gate electrode 19 is made of a layer of metal or silicide at a gate width of about 0.01 micron to about 1 micron.

A body region 23 is formed in semiconductor substrate 10 by doping, with a dopant of the p conductivity type, the main surface 2 proximate the gate electrode 19 and the p columns 11. In an exemplary embodiment, the body region 23 has a dopant of the p conductivity type at a concentration suitable for forming an inversion layer that operates as conduction channels of the device, and it extends from the main surface 2 toward the main surface 4 to a depth of about 1.0 to about 5.0 microns. Body region 23 can be formed prior to, or subsequent to, formation of gate electrode 19 or formation of gate opening 40. In various preferred embodiments of the present invention, body region 23 is formed prior to forming gate opening 40.

A source region 27 is formed in semiconductor layer 5 by doping, with a dopant of the n conductivity type, the main surface 2 proximate the gate electrode 19 and the body region 23. In an exemplary embodiment, source region 27 has a dopant of the n conductivity type at a concentration suitable to provide a low contact resistance with a source electrode at main surface 2, and it extends from main surface 2 to a depth of about 0.2 microns to about 0.5 microns.

An interlayer dielectric (ILD) deposition 20 is then deposited over the gate electrodes 19, gate dielectric layer 21, and over the rest of the main surface 2. In an exemplary embodiment, the ILD layer 20 comprises a deposited silicon oxide about 0.5 to about 1.5 microns in thickness.

Sidewall openings (not shown) are formed by etching to remove the refill material 8 at appropriate positions to expose a part of the sidewall surface 37 proximate the main surface 2. A body contact region 25 is then formed by doping, with a dopant of the p conductivity type, the exposed part of the sidewall surface 37. In an exemplary embodiment, body contact region 25 has a dopant of the p conductivity type at a concentration suitable to provide a low contact resistance with a source electrode, and it extends from side 35 toward the n column 13 to a width of about 0.2 micron to about 0.5 micron.

In exemplary embodiments, to form the p body region 23, p body contact 25, or the n source region 27, p-type dopant or n-type dopant is ion implanted into the semiconductor layer 5 at an energy level of about 30-1000 KeV with a dose range from about $1 \times 10^{10}$ to $1 \times 10^{16}$ atoms $cm^{-2}$, preferably from about $1 \times 10^{14}$ to $1 \times 10^{16}$ atoms $cm^{-2}$, followed by a high temperature drive-in step (i.e., a diffusion).

In a preferred embodiment, the gate electrode 19 is formed before the formation of the three doped regions: p body region 23, n source region 27, and the p body contact 25. Self-alignment technique is used to precisely align the three doped regions with the gate electrode. In another embodiment, the gate electrode 19 is formed after the formation of the three doped regions 23, 25, 27.

Performed with, prior or subsequent to the step of forming sidewall openings, contact hole openings (not shown) are formed by removing the ILD deposition at appropriate positions to expose a portion of side 30 of the source region 27 at main surface 2.

Using methods known in the field, metallization is performed to deposit a layer of metal 17, which serves as the source electrode, over the contact hole openings, the sidewall openings, and the remaining ILD deposition. Passivation is performed using methods known in the field with an appropriate passivation material such as nitride, oxide or PSG. A backside or drain electrode 15 is also provided at the second main surface 4.

The process embodiments of the present invention are versatile as no particular sequence order of the steps is required, the n columns and p columns can be exchanged, etc. The different embodiments may be used to make any type of semiconductor device, including, but not limited to, a superjunction MOSFET, a superjunction MESFET, a superjunction Schottky transistor, a superjunction IGBT, a thyristor, a diode, and similar devices.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A superjunction semiconductor device comprising:
   (a) a column of a first conductivity type extending from a first main surface of a semiconductor substrate toward a second main surface of the semiconductor substrate opposed to the first main surface to a first depth position, and having a first concentration of a dopant of the first conductivity type;
   (b) a column of a second conductivity type opposite to the first conductivity type, having a second concentration of a dopant of the second conductivity type, and having a first sidewall surface proximate the column of the first conductivity type and a second sidewall surface opposed to the first sidewall surface;
   (c) a body contact region proximate the column of the second conductivity type, and having a third concentration of a dopant of the second conductivity type higher than the second concentration;
   (d) a source electrode connected to the body contact region at a body contact interface including at least a first side of the body contact region other than a portion of the first main surface;
   (e) a source region proximate the body contact region and the first main surface, the source region having a fourth concentration of a dopant of the first conductivity type higher than the first concentration, and connected to the source electrode at a source contact interface including at least a first side of the source region other than a portion of the first main surface; and
   (f) a trench gate electrode disposed in a gate opening extending from the first main surface toward the second main surface to a depth position shallower than the first depth position, the trench gate electrode having a width defined in a direction parallel to the first main surface of the semiconductor layer, the gate opening having one or more sidewall surfaces proximate the source region and a body region, and having a bottom proximate the column of the first conductivity type, and a dielectric layer interposed between the trench gate electrode and the one or more sidewall surfaces of the gate opening and between the trench gate electrode and the bottom of the gate opening; the dielectric layer having a thickness between the trench gate electrode and a bottom surface of the gate opening greater than or equal to the width of the trench gate electrode.

2. The superjunction semiconductor device of claim 1, wherein a bottom surface of the trench gate electrode is tapered in a direction toward the bottom of the gate opening.

3. The superjunction semiconductor device of claim 1, wherein the bottom of the gate opening is concave.

4. The superjunction semiconductor device of claim 2, wherein the bottom of the trench gate electrode is one of arcuate or chamfered.

5. The superjunction semiconductor device of claim 1, wherein the source contact interface further comprises at least a portion of a second side of the source region at the first main surface.

6. The superjunction semiconductor device of claim 1, wherein the first side of the source region and the first side of the body contact region are at least one of aligned with the second sidewall surface of the column of the second conductivity type and perpendicular to the second main surface.

7. The superjunction semiconductor device of claim 1, further comprising a body region proximate the column of the second conductivity type, the body contact region, and the source region, the body region having a fifth concentration of a dopant of the second conductivity type higher than the second concentration, but lower than the third concentration.

8. The superjunction semiconductor device of claim 1, further comprising a trench proximate at least one of the columns, the trench being filled with at least one of a semi-insulating material and an insulating material.

9. The superjunction semiconductor device of claim 1, wherein the column of the first conductivity type and the column of the second conductivity type comprise epitaxial layers.

10. The superjunction semiconductor device of claim 1, the device being selected from the group consisting of a superjunction metal-oxide-semiconductor field-effect transistor (MOSFET), a superjunction metal-semiconductor field-effect transistor (MESFET), a superjunction Schottky transistor, a superjunction insulated-gate bipolar transistor (IGBT), a thyristor, and a superjunction diode.

* * * * *